United States Patent [19]
Kim et al.

[11] Patent Number: 5,973,531
[45] Date of Patent: *Oct. 26, 1999

[54] METHOD FOR GENERATING A PULSE OUTPUT IN A DYNAMIC REGISTER

[75] Inventors: Song C. Kim, Santa Clara; Kuan-yu J. Lin, Mountain View, both of Calif.

[73] Assignee: Sun Microsystems, Inc., Palo Alto, Calif.

[*] Notice: This patent is subject to a terminal disclaimer.

[21] Appl. No.: 08/879,591

[22] Filed: Jun. 20, 1997

[51] Int. Cl.$^6$ .......................... H03K 3/033; H03K 3/037; H03K 3/02

[52] U.S. Cl. .......................... 327/227; 327/198; 327/200; 327/212

[58] Field of Search .......................... 365/203; 327/198, 327/199, 200, 201, 227, 291, 208, 212, 210, 211

[56] References Cited

U.S. PATENT DOCUMENTS

| | | | |
|---|---|---|---|
| 4,893,034 | 1/1990 | Tamaru | 327/198 |
| 5,467,037 | 11/1995 | Kumar et al. | 327/198 |
| 5,528,178 | 6/1996 | Pelella | 327/198 |
| 5,764,089 | 6/1998 | Partovi et al. | 327/200 |

*Primary Examiner*—Taon Tran
*Attorney, Agent, or Firm*—Conley, Rose & Tayon, PC; B. Noel Kivlin

[57] ABSTRACT

A dynamic pulse register which uses a standard clock signal and exhibits reduced propagation delay. The dynamic pulse register includes a precharge logic block configured to precharge an evaluate signal and an evaluate complement signal during a precharge phase. During an evaluate phase, a pulldown logic block is configured to discharge either the evaluate or evaluate complement signal in response to a valid data input to the pulse register. A driver logic block is configured to convey a data out signal as the complement of the evaluate complement signal, and a data out complement signal as the complement of the evaluate signal. Either the data out signal or the data out complement signal is thus charged (thereby producing the rising edge of the output pulse) in response to the discharging performed by the pulldown logic block. A subsequent rising edge of a delayed version of the clock signal is employed by a reset unit to generate a precharge signal which charges the evaluate and evaluate complement signal back to their precharge logic state. The data out and data out complement signals are correspondingly discharged, producing the falling edge of the output pulse and terminating assertion of the precharge signal. The dynamic pulse register is thus able to generate a pulse output in a single logic stage employing a standard clock signal. The speed of the pulse register may be advantageously increased without introducing the complexity of an early clock signal.

9 Claims, 5 Drawing Sheets

METHOD FOR GENERATING A PULSE OUTPUT IN A DYNAMIC REGISTER

BACKGROUND OF THE INVENTION

1. Field of the Invention

The present invention relates to the field of dynamic logic design and, more particularly, to a method for generating a pulse output in a dynamic register.

2. Description of the Related Art

Many circuit designs employ dynamic logic. Unlike static logic gates, which only transition upon a corresponding input transition, dynamic logic gates may transition both during a precharge phase and an evaluate phase of a clock signal. In the precharge phase, a dynamic node is conditionally charged to a given logic state. In the evaluate phase, the node either remains charged or is discharged in accordance with the particular logic function being implemented. Correct operation of a dynamic logic gate thus depends upon the capacitance of the dynamic node retaining the precharged value until the precharge phase begins. Dynamic logic, while more complex than static logic, may be advantageously employed to achieve higher operating speeds.

One type of dynamic logic design technique is self-resetting circuitry. Instead of using the clock to control when the precharge and evaluate phases occur, narrow pulse signals are employed to initiate precharge and evaluation. Accordingly, pulse input data is often required as input to a logic block implemented in self-resetting circuitry.

As used herein, a "pulse" is a signal including two transitions: an inactive-to-active transition followed by an active-to-inactive transition. For circuits in which a logic high state represents the active state, a pulse includes a transition from a logic low state to a logic high state, followed by a transition from the logic high state to the logic low state. The amount of time a pulse remains in the active state is known as the pulse width. Self-resetting circuits may be configured to generate adjustable pulse output widths.

Figure 1A:
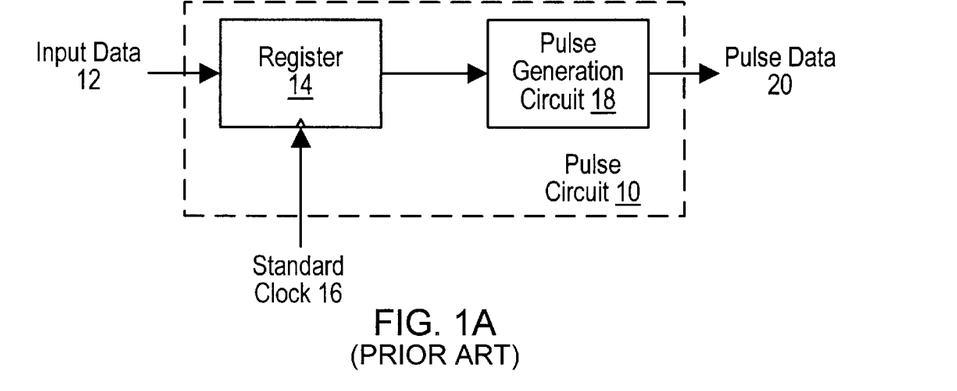
FIGS. 1A–1C are block diagrams of several pulse generation circuits.

Turning now to FIG. 1A, a pulse circuit 10 is depicted which generates pulse output data from a given input. As shown, pulse circuit 10 includes a register 14 and a pulse generation circuit 18. Register 14 receives input data 12 and a standard clock 16, while pulse generation circuit 18 receives the contents of register 14 and conveys pulse data 20 as output.

Register 14 receives input data 12 when standard clock 16 becomes active. This information is then conveyed to pulse generation circuit 18. Because the pulse width of the standard clock signal may be different from the desired pulse width for pulse data 20, pulse generation circuit 18 conveys pulse data 20, which is of the desired pulse width. A disadvantage of pulse circuit 10, however, is that the input data must propagate through two stages of logic to reach the output, thus increasing delay.

Figure 1B:
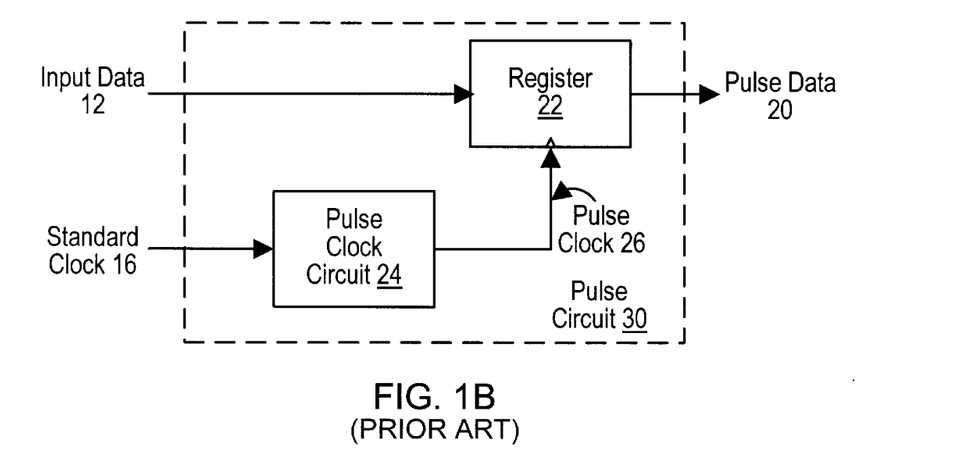

Turning now to FIG. 1B, another technique for pulse generation is exemplified by pulse circuit 30. As depicted, pulse circuit 30 includes a register 22 and a pulse clock circuit 24. Register 22 receives input data 12, a pulse clock 26, and conveys pulse data 20 as output. Pulse clock circuit 24 receives standard clock 16 and conveys pulse clock 26 as output.

Pulse circuit 30 employs pulse clock circuit 24 to generate pulse clock 26, which has a pulse width which is desired for pulse data 20. In this manner, pulse clock 26 may be used to read from register 22, thereby conveying pulse data 20 with a pulse width equal to that of pulse clock 26. Like pulse circuit 10, however, two stages of logic are employed in generating pulse data 20 from input data 12 in pulse circuit 30. The overall delay is similarly increased.

Figure 1C:
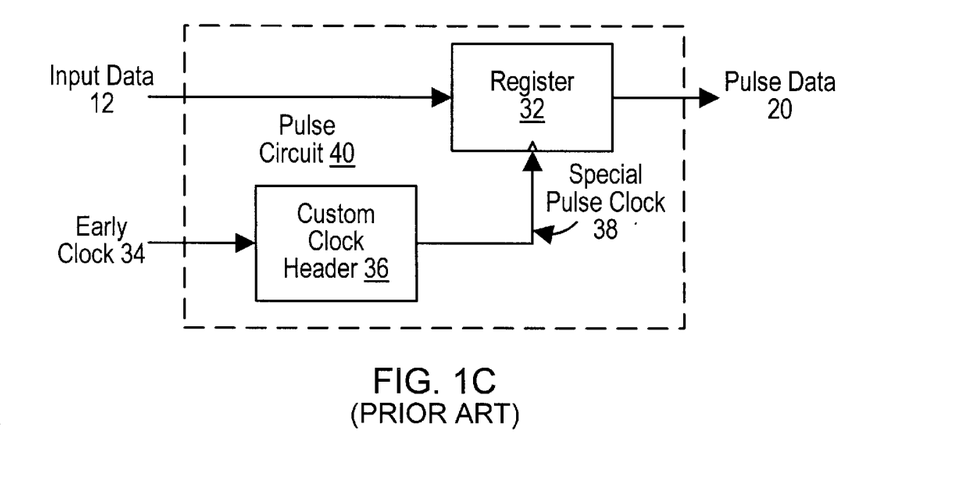

Turning now to FIG. 1C, another pulse generation circuit, pulse circuit 40, is shown. As depicted, pulse circuit 40 includes a register 32 and a custom clock header 36. Register 32 receives input data 12, a special pulse clock 38, and conveys pulse data 20 as output. Custom clock header 36 receives early clock 34 as input and conveys special pulse clock 38 as output.

An early clock signal such as early clock 34 may be used as an input to custom clock header 36. The resulting output of custom clock header 36, special pulse clock 38, is a clock signal of the desired pulse width which aligns precisely with the rising edge of a standard clock signal. Because the rising edge of early clock 34 precedes a corresponding rising edge of a standard clock signal, special pulse clock 38 is available to register 32 at the same time the input data is sampled, thus reducing delay.

Early clock signals are not available in all logic circuits, however. Even if an early clock signal is available, design of custom clock header 36 may be difficult, since a precision early clock-to-standard clock delay match circuit is required. Precise rise and fall slew rates requirements for special pulse clock 38 add further design difficulties.

It would therefore be desirable to have a method for generating a pulse output from a dynamic register which employs a standard clock signal and exhibits reduced propagation delay.

SUMMARY OF THE INVENTION

The problems outlined above are in large part solved by a method for generating a pulse output from a dynamic register in accordance with the present invention. In one embodiment, a dynamic pulse register is provided which uses a standard clock signal and exhibits reduced propagation delay. The dynamic pulse register includes a precharge logic block configured to precharge an evaluate signal at an evaluate node and an evaluate complement signal at an evaluate complement node during a precharge phase. During an evaluate phase, a pulldown logic block is configured to discharge either the evaluate or evaluate complement signal in response to a valid data input to the pulse register. A driver logic block is configured to convey a data out signal as the complement of the evaluate complement signal, and a data out complement signal as the complement of the evaluate signal. Either the data out signal or the data out complement signal is thus charged (thereby producing the rising edge of the output pulse) in response to the discharging performed by the pulldown logic block. A subsequent rising edge of a delayed version of the clock signal is employed by a reset unit to generate a precharge signal which charges the evaluate and evaluate complement signal back to their precharge logic state. The data out and data out complement signals are correspondingly discharged, producing the falling edge of the output pulse and terminating assertion of the precharge signal. The dynamic pulse register is thus able to generate a pulse output in a single logic stage employing a standard clock signal. The speed of the pulse register may be advantageously increased without introducing the complexity of an early clock signal.

Broadly speaking, the present invention contemplates a method for generating a pulse output corresponding to a data input, comprising charging a dynamic node to a first logic state during a precharge phase of a given cycle of a clock signal, the method next comprises selectively discharging the dynamic node during an evaluate phase of the given cycle of the clock signal in response to a value of the data input. The method further comprises generating a reset signal in response to a delayed version of the clock signal received during the given cycle of the clock signal. Still further, the method includes generating a precharge signal in response to receiving the reset signal, and charging the dynamic node to the first logic state in response to receiving the precharge signal.

The present invention further contemplates a method for generating a pulse output corresponding to a data input, comprising charging a dynamic node to a logic high state when a clock signal is in a logic low state. The method next comprises selectively discharging the dynamic node when the clock signal is in a logic high state in response to a value of the data input. The method further comprises generating a reset signal in response to a delayed version of the clock signal, and then conveying a precharge signal to the precharge unit in response to receiving the reset signal. Finally, the method comprises precharging the dynamic node to the logic high state in response to receiving the precharge signal.

BRIEF DESCRIPTION OF THE DRAWINGS

Other objects and advantages of the invention will become apparent upon reading the following detailed description and upon reference to the accompanying drawings in which:

FIG. 7 is a timing diagram depicting operation of one embodiment of a dynamic pulse register.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
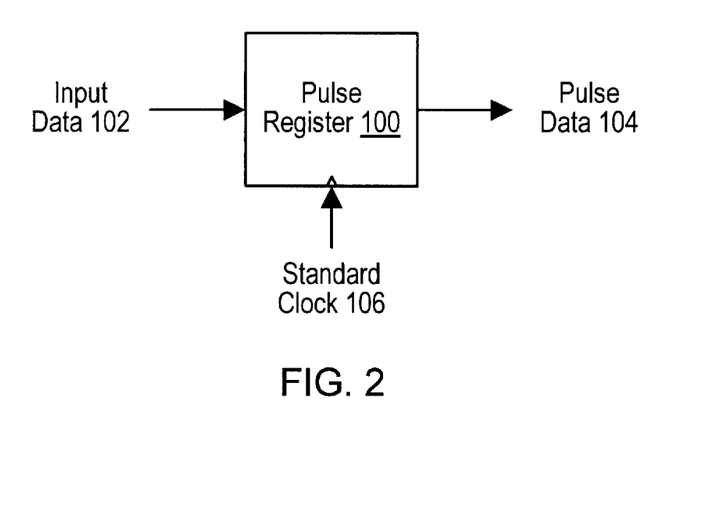
FIG. 2 is a high-level block diagram of one embodiment of a dynamic pulse register.

Turning now to FIG. 2, a high-level block diagram is shown of one embodiment of a dynamic pulse register. As depicted, a pulse register 100 receives input data 102, a standard clock 106, and conveys pulse data 104 as output. In contrast to the circuits described with reference to FIG. 1, pulse register 100 employs a standard clock signal to produce a pulse output from an input data signal in a single stage of logic. Device speed may thus be advantageously increased.

Figure 3:
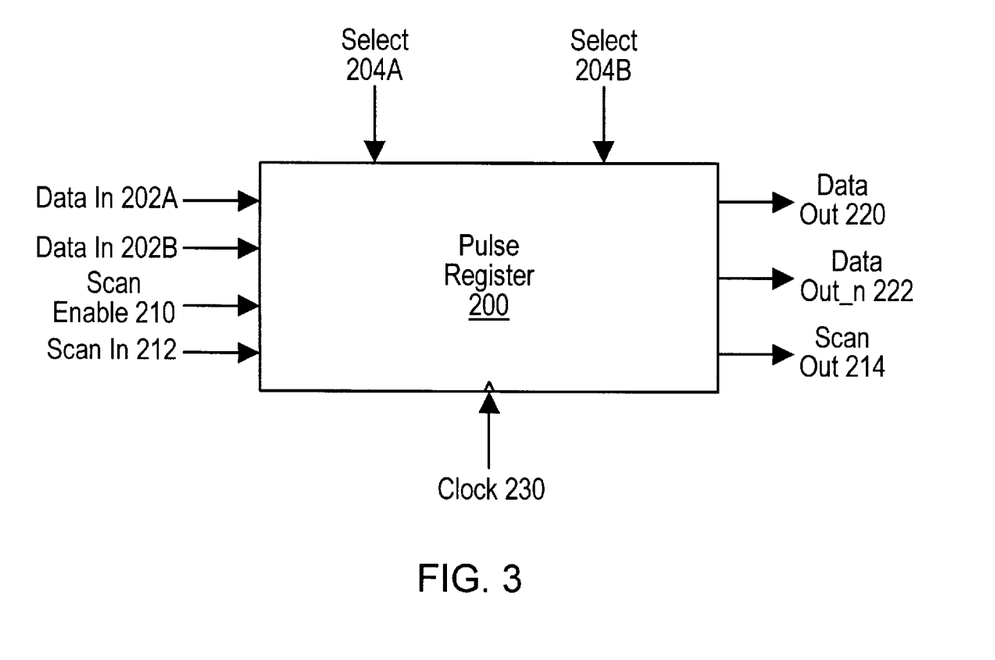
FIG. 3 is a block diagram depicting external connections of one embodiment of a dynamic pulse register.

Turning now to FIG. 3, the external connections of one implementation of a pulse register 200 are depicted. Like pulse register 100, pulse register 200 produces a pulse output from a data input in a single logic stage. As shown, pulse register 200 receives data in signals 202A–B, a scan enable signal 210, a scan in signal 212, select signals 204A–B, a clock signal 230, a data out signal 220, a data out_n signal 222 (which, as will be described below, is the complement of data out signal 220 when output data is valid), and a scan out signal 214.

In one embodiment, pulse register 200 is configured to select from three different inputs: data in signal 204A, data in signal 204B, and scan in signal 212. When scan enable signal 210 is inactive, select signals 204 are used to qualify which of data in signals 202 is valid. When select signal 204A is active (and scan enable signal 210 is inactive), data in signal 202A is selected as an input to pulse register 200. Similarly, when select signal 204B is active (and scan enable signal 210 is inactive), data in signal 202B is selected as an input. In response to receiving a valid data in signal 202, pulse register 200 produces a pulse output on either data out signal 220 or data out_n signal 222. If the selected data in signal 202 is in a logic high state, a pulse is generated on data out signal 220. Conversely, if the selected data in signal 202 is in a logic low state, a pulse is generated on data out_n signal 222.

When scan enable signal 210 is active, however, pulse register 200 selects scan in signal 212 as input. As above, pulse register 200 conveys a pulse output in response to an input signal: a pulse is generated on data out signal 220 if scan in signal 212 is in a logic high state, while a pulse is generated on data out_n signal 222 if scan signal 212 is in a logic low state. Additionally, the value of data out signal 220 is conveyed on scan out signal 214 as a static signal.

Scan enable signal 210 activates a scan mode which is used to test logic circuits. A number of devices are coupled by connecting the scan output of one device to the scan input signal of another, forming a "scan chain". A bit stream is then clocked into a given scan chain while in scan mode, setting the corresponding logic devices into a desired state. A system clock is applied, causing the logic circuits to evaluate the data at their inputs. The resulting bit stream is then scanned out to check for proper operation.

Figure 4:
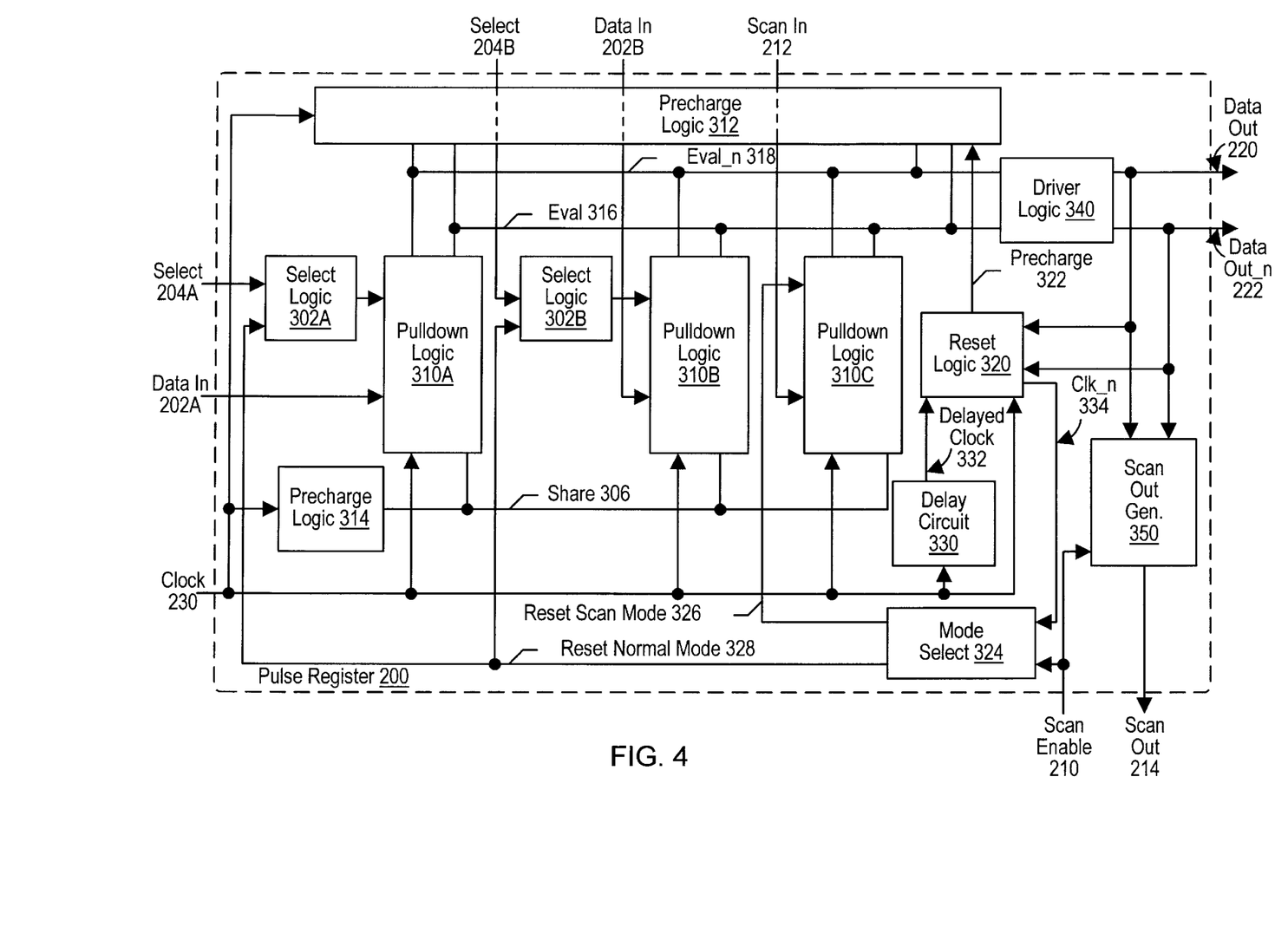
FIG. 4 is a block diagram depicting internal connections of one embodiment of a dynamic pulse register.

Turning now to FIG. 4, a block diagram of internal connections of one embodiment of pulse register 200 are depicted. As shown, pulse register 200 includes a precharge logic block 312, select logic blocks 302A–B, pulldown logic blocks 310A–C, a precharge logic block 314, a driver logic block 340, a reset logic block 320, a delay circuit 330, a mode select block 324, and a scan out generation block 350. Pulldown logic 310A receives selection control from select logic 302A (provided in response to select signal 204A and a reset normal mode signal 328 from mode select block 324), and input data from data in signal 202A. Pulldown logic 310A additionally receives clock signal 230, and is coupled to a share node 306 (controlled by precharge logic block 314). Finally, pulldown logic 310A is coupled to precharge logic 312, pulldown logic 310B–C, and driver logic 340 via eval signal 316 and eval_n signal 318.

Similarly, pulldown logic 310B receives selection control from selection logic 302B (provided in response to select signal 204B and reset normal mode signal 328), and input data on data in signal 202B. Pulldown logic 310B additionally receives clock signal 230, and is also coupled to share node 306, eval signal 316, and eval_n signal 318. Pulldown logic 310C employs a reset scan mode signal 326 (conveyed from mode select block 324) as a select input, and receives scan in signal 212 as input data. Pulldown logic 310C also receives clock signal 230, and is coupled to share node 306, eval signal 316, and eval_n signal 318.

Reset logic 320 receives clock signal 230 and a delayed clock signal 332, which is conveyed by delay circuit 330 in response to receiving clock signal 230. Reset logic 320 also conveys a precharge signal 322 to precharge logic block 312, and a clock_n signal 334 (the complement of clock signal 230) to mode select block 324.

Driver logic 340 conveys data out signal 220 and data out_n signal 222 in response to receiving eval_n signal 318 and eval signal 316, respectively. Data out signal 220 and data out_n signal 222 are conveyed both as outputs of pulse register 200 and as inputs to reset logic 320 and scan out generation block 350. Scan out generation block 350 additionally receives scan enable signal 210, and conveys scan out signal 214 as an output of pulse register 200.

Generally speaking, one of pulldown logic blocks 310 is employed to selectively discharge one of the evaluate signals in response to valid input data. Driver logic 340 conveys one or more output signals indicative of the values of the evaluate signals. Delay circuit 330 provides a delayed version of a clock signal in response to receiving the clock signal. Reset logic 320 asserts a reset signal (e.g., precharge signal 322) in response to a rising edge of the delayed clock provided by delay circuit 330. Precharge signal 322 then activates precharge drivers in unit 312 to charge both eval_n 318 and eval 316 nodes to a logic high state.

Upon a rising edge of clock signal 230, scan enable signal 210 and select signals 204 determine which of pulldown logic blocks 310 are employed to discharge signal 316 or 318. As described above, if scan enable signal 210 is active, pulse register 200 is in scan mode; accordingly, reset scan mode signal 326 is active and pulldown logic block 310C is selected. If scan enable signal 210 is not active, however, pulse register 200 is in normal mode. If either of select signals 204A–B is asserted, the corresponding pulldown logic 310 (either 310A or 310B) is employed to discharge eval signal 316 or eval_n signal 318.

When clock signal 230 transitions to a logic high state (beginning the evaluate phase), precharge logic 314 discharges share node 306 to a logic low state. The selected pulldown logic block 310 then has a window of opportunity to discharge either eval signal 316 or eval_n signal 318. Which signal is discharged depends on the value of the data input (202A, 202B, or 212). If the data input is high, eval_n signal 318 is discharged; if the data input is low, eval signal 316 is discharged. In either case, the discharging is effected by activating a transistor coupled both to the signal and to share node 306 (which is in a logic low state when clock signal 230 is in a logic high state). The window of opportunity for discharging the signal ends when reset normal mode signal 328 is deasserted, thereby de-activating the select input to the pulldown logic block 310. Reset normal mode signal 328 is de-asserted in response to a rising edge of clock signal 230, but because of several gate delays, this de-assertion occurs subsequent to the discharging of the appropriate signal 316 or 318.

Driver logic 340 is configured to convey data out signal 220 and data out_n signal 222 as the complements of eval_n signal 318 and eval signal 316, respectively. When precharge signal 322 is asserted, signals 316 and 318 are driven to a logic high state via precharge drivers in precharge logic 312. Data out signal 220 and data out_n signal 222 are then driven to a logic low state. When either eval_n signal 318 or eval signal 316 discharges, the corresponding output signal 220/222 charges to a logic high state, thereby forming the rising edge of the output pulse. For example, the discharging of eval signal 316 to a logic low state causes data out_n signal 222 to charge to a logic high state. As used herein, "output pulse" refers to a pulse produced on either data out signal 220 or data out_n signal 222 in response to valid data presented to pulse register 200.

The falling edge of the output pulse is generated in response to precharge signal 322 being asserted by reset logic 320. When activated, precharge signal 322 causes precharge logic 312 to charge both eval signal 316 and eval_n signal 318 back to a logic high state. Because driver logic 340 conveys data out signal 220 and data out_n signal 222 as complements of signals 316 and 318, outputs 220 and 222 are accordingly discharged to a logic low state, thereby producing the falling edge of the output pulse.

The pulse width of the output pulse produced on either data out signal 220 or data out_n signal 222 is determined by when precharge signal 322 is asserted by reset logic 320 in relation to the rising edge of clock signal 230. Precharge signal 322 is asserted in response to the rising edge of delayed clock signal 332, which is conveyed by delay circuit 330. Delay circuit 330 conveys clock signal 230 through a number of logic gates to generate delayed clock signal 332, which trails clock signal 230 by a fixed amount of time. This fixed amount of time is used to control the pulse width of the output of pulse register 200, since the rising edge of delayed clock signal 332 causes the falling edge of the output pulse.

As described above, the assertion of precharge signal 322 causes eval signal 316 and eval_n signal 318 to be charged to a logic high state, and data out signal 220 and data out_n signal 222 to be discharged to a logic low state. Reset logic 320 de-asserts precharge signal 322 in response to both delayed clock signal 332 and a feedback signal being a logic high state. When either data out signal 220 or data out_n signal 222 is driven to a logic high state, the feedback signal is asserted to a logic high state, as will be shown with reference to FIG. 6.

As described above, mode select block 324 generates reset scan mode signal 326 and reset normal mode signal 328, which activate the appropriate select logic block 302. When scan enable signal 210 becomes valid (prior to the rising edge of clock signal 230), either reset scan mode signal 326 or reset normal mode signal 328 becomes active. This enables the selected pulldown logic block 310 to discharge either signal 316 or 318 when share node 306 is charged to a logic low state upon a rising edge of clock signal 230. The rising edge of clock signal 230 also causes the selected reset mode signal (either 326 or 328, depending on the state of scan enable signal 210) to become inactive, which inhibits pulldown logic 310 from continued discharging of eval signal 316 or eval_n signal 318. The selected reset mode signal does not become inactive for a period of time after a rising edge of clock signal 230, however. This allows the selected pulldown logic block 310 enough time to discharge eval signal 316 or eval_n signal 318. After the appropriate pulldown logic block 310 is de-activated, precharge signal 322 is asserted, causing both eval signal 316 and eval_n signal 318 to return to a logic high state.

When scan enable signal 210 is asserted, pulldown logic block 310C is employed to discharge either of signals 316 or 318, producing an output pulse on either signal 220 or 222 as described above. When an output pulse is conveyed on either data out signal 220 or data out complement signal 222, scan out generation block 350 also conveys the static value of data out signal 220 as scan out signal 214.

Figure 5:
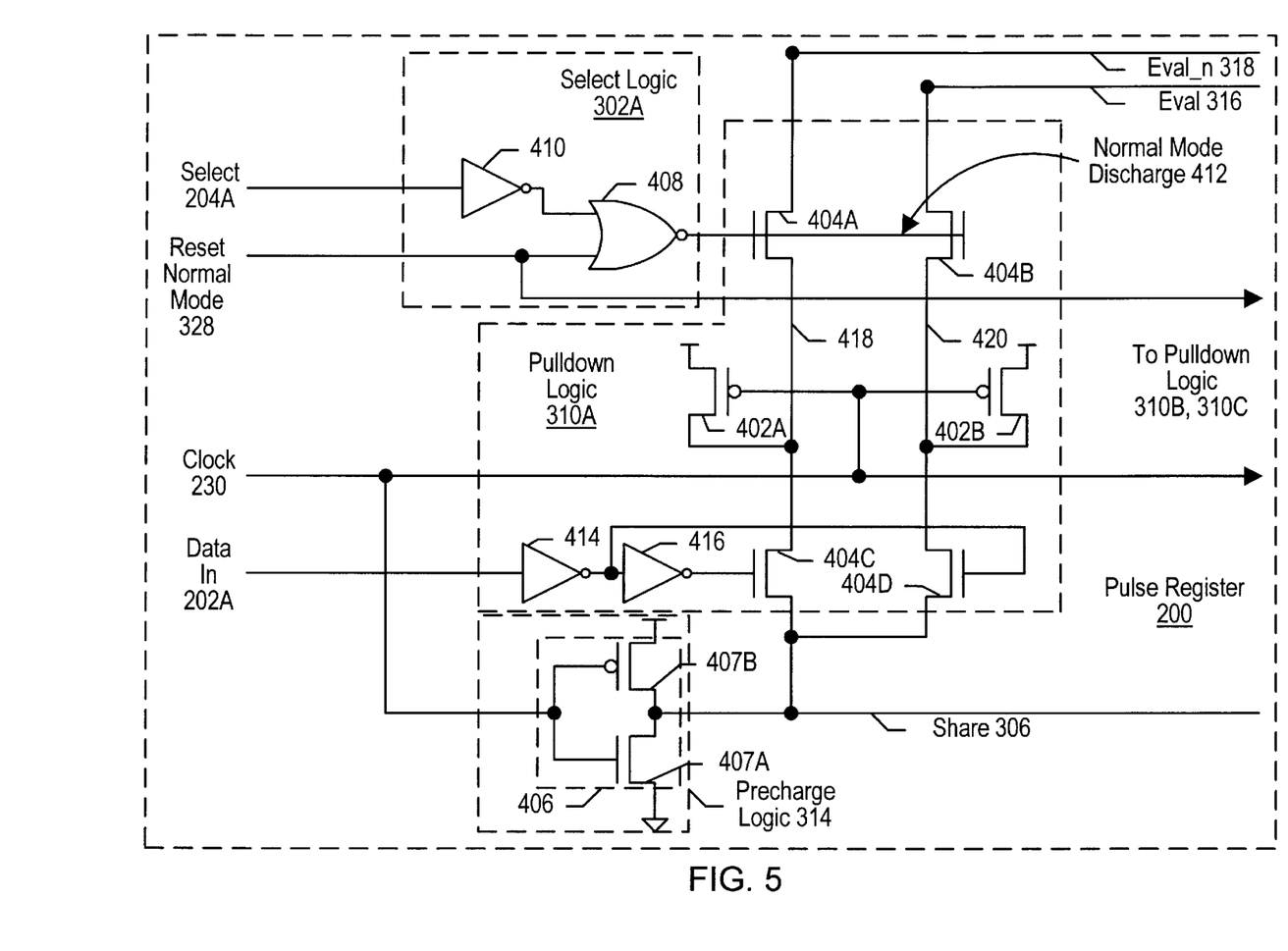
FIG. 5 is a circuit diagram of precharge and pulldown logic blocks employed in one implementation of a dynamic pulse register.

Turning now to FIG. 5, a circuit diagram of precharge and pulldown logic blocks employed in one implementation of a dynamic pulse register is depicted. Although only pulldown logic block 310A is illustrated in FIG. 5, pulldown logic blocks 310B–C operate in the same manner. As shown, pulse register 200 includes precharge logic block 314, a select logic 302A, and pulldown logic 310A. Precharge logic 314 includes a skewed inverter 406, which charges share node 306 to a logic high state in response to clock signal 230 being in a logic low state.

Select logic 302A includes an inverter 410 and a NOR gate 408. Select logic 302A receives select signal 204A and reset normal mode signal 328, and conveys a normal mode discharge signal 412 as an output of NOR gate 408. Pulldown logic 310A includes a pulldown transistor 404A, which is coupled to eval_n signal 318, an eval_n discharge node 418, and normal mode discharge signal 412; and a pulldown transistor 404B, which is coupled to eval signal 316, an eval discharge node 420, and normal mode discharge signal 412. Pulldown logic 310A further includes pullup transistors 402A and 402B, coupled to eval_n discharge node 418 and eval discharge node 420, respectively. Pullup transistors 402A–B are both controlled by clock signal 230. Pulldown logic 310A also includes an inverter 414, which receives data in signal 202A and conveys output to a pulldown transistor 404D and an inverter 416. Inverter 416 conveys output to a pulldown transistor 404C, which is also coupled to eval_n discharge node 418 and share node 306. Pulldown transistor 404D is similarly coupled to eval discharge node 420 and share node 306.

When clock signal 230 is in a logic low state, keeper transistor 407B is used to maintain share node 306 at a logic high state. Transistor 407B reduces charge-sharing problems between evaluate nodes (318, 316) and pulldown logic internal nodes (418, 420) and share node 306.

Prior to clock signal 230 becoming active, select signal 204A and scan enable signal 210 are valid. If scan enable signal 210 is de-asserted, reset normal mode signal 328 is active (in the logic low state). When select signal 204A becomes asserted, a logic low output is conveyed by inverter 410 to NOR gate 408, causing normal mode discharge signal 412 to be asserted. The assertion of normal mode discharge signal 412 couples eval signal 316 and eval_n signal 318 to eval discharge node 420 and eval_n discharge node 418, respectively.

Eval_n discharge node 418 and eval discharge node 420 are both precharged to a logic high value by pullup transistors 402A–B when clock signal 230 is in a logic low state. Nodes 418 and 420 are coupled to share node 306 via pullup transistor 404C or 404D. One of transistors 404C–D is activated in response to data in signal 202A, while the other transistor is de-activated. Thus, either eval signal 316 or eval_n signal 318 is coupled to share node 306 when normal mode discharge signal 412 is activated.

Normal mode discharge signal 412 is de-asserted on a rising edge of clock signal 230. As described above, however, there is a delay associated with reset normal mode signal 328 (and, correspondingly, normal mode discharge signal 412) being de-asserted in response to a rising edge of clock signal 230. Accordingly, eval signal 316 or eval_n signal 318 may be sufficiently discharged before further discharge is inhibited by the de-assertion of normal mode discharge signal 412. Furthermore, pullup transistors 402A–B are also de-activated when clock signal 230 is in a logic high state, allowing eval_n discharge node 418 or eval discharge node 420 to conditionally discharge in response to data in signal 202A.

When clock signal 230 transitions to a logic high state, share node 306 is charged to a logic low state via transistor 407A of inverter 406. Either eval_n discharge node 418 or eval discharge node 420 is thus discharged to a logic low state when a valid data in signal 202A is present. Accordingly, either eval signal 316 or eval_n signal 318 is discharged when clock signal 230 is in a logic high state, valid data in signal 202A is present, and normal mode discharge signal 412 is asserted. Subsequently, reset normal mode signal 328 is de-asserted, causing normal mode discharge signal 412 to be de-asserted, thus inhibiting further pulling down of signals 316 or 318.

Figure 6:
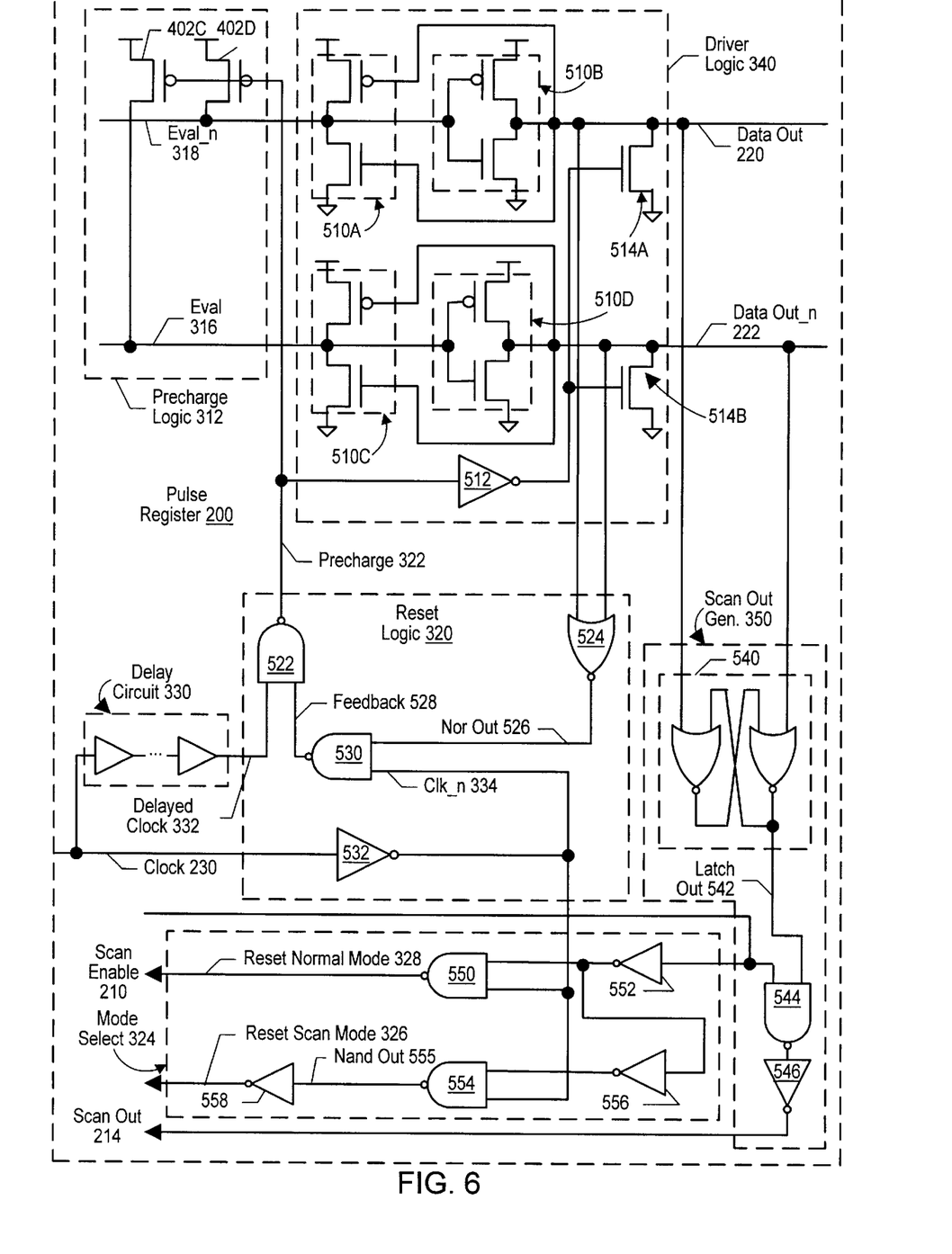
FIG. 6 is a circuit diagram of a driver unit, a reset logic block, a scan output driver, and scan enable circuitry employed in one implementation of a dynamic pulse register.

Turning now to FIG. 6, a circuit diagram of various logic blocks within one implementation of a dynamic pulse register is depicted. As shown, pulse register 200 includes precharge logic 312, driver logic 340, delay circuit 330, reset logic 320, mode select logic 324, and scan out generation block 350.

Precharge logic 312 includes a pullup transistor 402C, which is coupled to precharge signal 322 and eval signal 316, and a pullup transistor 402D, also coupled to precharge signal 322 as well as eval_n signal 318. Driver logic 340 includes inverters 510A–D, an inverter 512, and pulldown transistors 514A–B. Inverter 510A receives data out signal 220 as input, and conveys output to the input of inverter 510B (coupled to eval_n signal 318), which conveys output to data out signal 220. Inverters 510C–D are similarly cross-coupled between eval signal 316 and data out_n signal 222. Inverter 512 conveys an inverted version of precharge signal 322 to pulldown transistors 514A and 514B, coupled to data out signal 220 and data out_n signal 222, respectively.

Delay circuit 330 generates delayed clock 332 by conveying clock signal 230 through a series of buffers. The number of buffers employed in delay circuit 330 depends upon the desired width of the output pulse generated on data out signal 220 or data out n signal 222. Reset logic 320 includes a NAND gate 522, a NOR gate 524, a NAND gate 530, and an inverter 532. NOR gate 524 receives data out signal 220 and data out_n signal 222, and conveys a nor out signal 526 to NAND gate 530. NAND gate 530 also receives clk_n signal 334, generated by inverter 532 in response to receiving clock signal 230. NAND gate 530 conveys a feedback signal 528 to NAND gate 522, which also receives delayed clock 332. NAND gate 522 conveys precharge signal 322 to precharge logic 312 and driver logic 340.

Mode select 324 includes an inverter 552, an inverter 556, an inverter 558, a NAND gate 550, and a NAND gate 554. Inverter 552 conveys an inverted version of scan enable signal 210 both to NAND gate 550 and to inverter 556. NAND gate 550 also receives clk_n signal 334 and conveys reset normal mode signal 328 as output. Inverter 556 conveys a non-inverted version of scan enable signal 210 to NAND gate 554, which also receives clk_n signal 334. NAND gate 554 conveys a nand out signal 554 to inverter 558. Inverter 558 conveys an inverted output signal as reset scan mode signal 326. Scan out generation block 350 includes a latch 540, a NAND gate 544, and an inverter 546. Latch 540 receives data out signal 220 and data out_n signal 222 as inputs, conveying latch out signal 542 as an output to NAND gate 544. NAND gate 544 also receives scan enable signal 210 as an input, and conveys output to inverter 546, which conveys scan out signal 214 as an output of pulse register 200.

As described with reference to FIG. 5, one of signals 316/318 may be discharged if valid input data is presented to pulse register 200 upon a rising edge of clock signal 230. The discharging of either eval signal 316 or eval_n signal 318 causes a corresponding charging of either data out signal 220 (if eval_n signal 318 is discharged) or data out_n signal 222 (if eval signal 316 is discharged), thereby producing the rising edge of the output pulse of pulse register 200.

Driver logic 340 conveys data out signal 220 and data out_n signal 222 as the complements of eval_n signal 318 and eval signal 316. To this end, driver logic 340 employs a pair of cross-coupled inverters 510 connected to each of signals 316 and 318. Thus, when eval signal 316 and eval_n signal 318 are precharged by precharge logic 312 to a logic high state, data out signal 220 and data out_n signal 222 are discharged to a logic low state. Similarly, when one of signals 316/318 is discharged, a corresponding signal 222/220 is charged. Data out signals 220/222 remain at logic high states via full-latched inverters 510A/510C, respectively.

The falling edge of the output pulse of pulse register 200 is caused by the assertion of precharge signal 322. Precharge signal 322 is asserted (to a logic low state) in response to delayed clock signal 332 and feedback signal 528 both being in a logic high state. Feedback signal 528 is in a logic high state unless both nor out signal 526 and clk_n signal 334 are in a logic high state. Upon a rising edge of clock signal 230, clk_n signal 334 transitions to a logic low state, forcing feedback signal 528 to a logic high state. Since feedback signal 528 is in a logic high state, precharge signal 322 is thus asserted in response to a rising edge of delayed clock 332, conveyed by delay circuit 330.

Because the rising edge of delayed clock 332 causes precharge signal 322 to be asserted, the width of the output pulse of pulse register 200 may be adjusted by varying the delay between the rising edge of clock signal 230 and the rising edge of delayed clock signal 332. An increased pulse width may be obtained by increasing the amount of delay in delay circuit 330.

When precharge signal 322 is asserted to a logic low state, pullup transistors 402C–D are turned on, causing eval signal 316 and eval_n signal 318 to be pulled up to a logic high state. Concurrently, precharge signal 322 is conveyed to inverter 512, which activates pulldown transistors 514A–B coupled to data out signal 220 and data out_n signal 222. In this manner, the falling edge of the output pulse is produced. Data out signals 220/222 are held at logic low states via full-latched inverters 510A/C, respectively.

When data out signal 220 and data out_n signal 222 are both discharged to a logic low state in response to precharge signal 322, nor out signal 526 transitions to a logic high state. If clk_n signal 334 is in a logic high state when nor out signal 526 also becomes a logic high, feedback signal 528 transitions to a logic low state. Otherwise, upon the falling edge of clock signal 230 (and the rising edge of clk_n signal 334), feedback signal 528 transitions to a logic low state. In either case feedback signal 528 becomes a logic low when both inputs to NAND gate 530 are in a logic high state. When feedback signal 528 is in a logic low state, precharge signal 322 is de-asserted. Pulse register 200 is thus prepared to receive a new data input.

When an output pulse is conveyed by pulse register 200, the value of data out signal 220 is conveyed by latch 540 as latch out signal 542 to NAND gate 544. If scan enable signal 210 is de-asserted, the output of NAND gate 544 will be a logic high, causing scan out signal 214 to be a logic low value. If scan enable 210 is asserted, however, NAND gate 544 acts as inverter for the value conveyed on latch out signal 542. The inverted value of latch out signal 542 is conveyed to inverter 546, which conveys a non-inverted version of latch out signal 542 (which is the same as the value of data out signal 220) as scan out signal 214. It is noted that latch out signal 542 is the static version of pulse outputs 220 and 222.

Reset normal mode signal 328 is asserted to a logic low state when both inputs to NAND gate 550, an inverted version of scan enable signal 210 and clk_n signal 334 are in a logic high state. If scan enable 210 is asserted, then, reset normal mode signal 328 is not active. If scan enable 210 is not asserted, however, reset normal mode signal 328 becomes asserted when clk_n signal 334 is in a logic high state (meaning clock signal 230 is in a logic low state). When clk_n signal 334 transitions to a logic low state on a rising clock signal 230 edge, reset normal mode signal 328 is de-asserted which inhibits both pulldown logic blocks 310A–B from discharging eval signal 316 or eval_n signal 318. As described above, enough of a delay is associated with the active-to-inactive transition of reset normal mode signal 328 that discharge of one of signals 316/318 is effected prior to reset normal mode signal 328 deactivating normal mode discharge signal 412.

Turning now to FIG. 7, a timing diagram depicting operation of one implementation of a dynamic pulse register is shown. FIG. 7 illustrates the operation of pulse register 200 when scan enable signal 210 is de-asserted, data in 202A is in a logic low state, and select signal 204A is active. Pulse register 200 operates similarly when scan enable 210 is asserted, data in 202 is in a logic high state, or pulldown logic block 310B is selected by select signal 204B.

Prior to a rising edge of clock signal 230, a valid data in signal 202, select signal 204, and scan enable signal 210 are presented to pulse register 200. When scan enable 210 becomes de-asserted (as a logic low value in the example shown in FIG. 7), reset normal mode signal 328 transitions to a logic low state, and reset scan mode signal 326 transitions to a logic low state. Reset normal mode signal 328, asserted in the logic low state, causes normal mode discharge signal 412 to become active.

The asserted normal mode discharge signal 412, along with a rising edge of clock signal 230, cause eval signal 316 to discharge in response to data in signal 202A being in the logic low state. The discharge of eval signal 316 causes a corresponding charging of data out_n signal 222. The rising edge of clock signal 230 also causes reset normal mode signal 328 to be de-asserted, which in turn causes normal mode discharge signal 412 to be de-asserted as well. When normal mode discharge signal 412 is de-asserted pulldown logic blocks 310 no longer discharge signals 316/318. At the point in time normal mode discharge signal 412 is de-activated, however, the rising edge of the output pulse is already charged, with the logic high state preserved by inverter 510C.

Subsequent to the charging of data out_n signal 222, the rising edge of delayed clock 332 occurs. This causes precharge signal 322 to be asserted, which precharges eval signal 316 (and eval_n signal 318) and discharges data out_n signal 222 (and data out signal 220), thus producing the falling edge of the output pulse of pulse register 200. Again, inverter 510C preserves the logic state (low) of data out_n signal 222. The discharging of data out_n signal 222 is employed to de-assert precharge signal 322, as described above. Pulse register 200 is thus prepared for a subsequent access.

Numerous variations and modifications will become apparent to those skilled in the art once the above disclosure is fully appreciated. It is intended that the following claims be interpreted to embrace all such variations and modifications.

What is claimed is:

1. A method for generating a pulse output corresponding to a data input, wherein a pulse width of said pulse output is determined by a first edge and a second edge, wherein said first edge represents an inactive-to-active transition and said second edge represents an active-to-inactive transition of said pulse output, said method comprising:

charging a dynamic node to a first logic state during a precharge phase of a given cycle of a clock signal;

selectively discharging said dynamic node during an evaluate phase of said given cycle of said clock signal in response to a value of said data input, thereby generating said first edge of said pulse width;

inhibiting discharging said dynamic node in response to a select input being inactive;

generating a reset signal in response to a delayed version of said clock signal received during said given cycle of said clock signal;

generating a precharge signal in response to receiving said reset signal; and charging said dynamic node to said first logic state in response to receiving said precharge signal, thereby generating said second edge of said pulse width.

2. The method as recited in claim 1 further comprising activating said select input in response to a evaluate unit select signal and a normal mode reset signal being active.

3. The method as recited in claim 2 wherein said normal mode reset signal is configured to become inactive a fixed length of time after said clock signal enters said evaluate phase of said cycle of said clock signal.

4. The method as recited in claim 3 wherein said select input is configured to become inactive subsequent to said discharging said dynamic node and prior to said precharge unit charging said dynamic node in response to receiving said precharge signal.

5. A method for generating a pulse output cooresponding to a data input, wherein a pulse width of said pulse output is determined by a first edge and a second edge, wherein said first edge represents an inactive-to-active transition and said second edge represents an active-to-inactive transition of said pulse output, said method comprising:

charging a dynamic node to a first logic step during a precharge phase of a given cycle of a clock signal;

selectively discharging said dynamic node during an evaluate phase of said given cycle of said clock signal in response to a value of said data input or a second data input depending on a select input corresponding to each of said data inputs, thereby generating said first edge of said pulse width;

generating a reset signal in response to a delayed version of said clock signal received during said given cycle of said clock signal;

generating a precharge signal in response to receiving said reset signal; and charging said dynamic node to said first logic state in response to receiving said precharge signal, thereby generating said second edge of said pulse width.

6. The method as recited in claim 5 wherein said selectively discharging said dynamic node in response to said second data input occurs when said second select input correspond to said second data input is active.

7. A method for generating a pulse output corresponding to a data input, wherein a pulse width of said pulse output is determined by a first edge and a second edge, wherein said first edge represents an inactive-to-active transition and said second edge represents an active-to-inactive transition of said pulse output, said method comprising:

charging a dynamic node to a first logic state during a precharge phase of a given cycle of a clock signal;

selectively discharging said dynamic node during an evaluate phase of said given cycle of said clock signal in response to a value of said data input and, thereby generating said first edge of said pulse width;

generating a reset signal in response to a delayed version of said clock signal received during said given cycle of said clock signal;

generating through a reset unit a precharge signal in response to receiving said reset signal, wherein said precharge signal is asserted for a given amount of time during said evaluate phase of said given cycle of said clock signal;

charging said dynamic node to said first logic state in response to receiving said precharge signal, thereby generating said second edge of said pulse width; and detecting through said reset unit when said dynamic node is precharged in response to said precharge signal.

8. The method as recited in claim 7 further comprising controlling said given amount of time for asserting said precharge signal depending upon when said dynamic node is detected as being precharged.

9. A method for generating a pulse output corresponding to a data input comprising:

charging a dynamic node and a second dynamic node to a logic high state through a precharge unit when a clock signal is in a logic low state;

selectively discharging said dynamic node and said second dynamic node in response to a value of said data input when said clock signal is in a logic high state;

generating a reset signal in response to a delayed version of said clock signal;

conveying a precharge signal to said precharge unit in response to receiving said reset signal;

precharging said dynamic node and said second dynamic node to said logic high state in response to receiving said precharge signal;

conveying a complement of an evaluate complement value generated at said second dynamic node as said pulse output;

conveying a complement of an evaluate value generated at said dynamic node as a complement of said pulse output; and further conveying said pulse output as a scan output when a scan mode is enabled.

* * * * *

UNITED STATES PATENT AND TRADEMARK OFFICE
CERTIFICATE OF CORRECTION

PATENT NO. : 5,973,531
DATED : October 26, 1999
INVENTOR(S) :
    Song C. Kim and Kuan-yu J. Lin It is certified that error appears in the above-identified patent and that said Letters Patent is hereby corrected as shown below:

Claim 6, col. 12, line 4, please change "correspond" to "corresponding".

Signed and Sealed this

Second Day of May, 2000

Q. TODD DICKINSON

*Attest:*

*Attesting Officer*      *Director of Patents and Trademarks*